United States Patent
Xu et al.

(10) Patent No.: US 8,574,977 B2
(45) Date of Patent: Nov. 5, 2013

(54) METHOD FOR MANUFACTURING STACK STRUCTURE OF PMOS DEVICE AND ADJUSTING GATE WORK FUNCTION

(75) Inventors: Qiuxia Xu, Beijing (CN); Yongliang Li, Beijing (CN)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 63 days.

(21) Appl. No.: 13/503,358

(22) PCT Filed: Nov. 21, 2011

(86) PCT No.: PCT/CN2011/082538
§ 371 (c)(1),
(2), (4) Date: Apr. 20, 2012

(87) PCT Pub. No.: WO2012/113247
PCT Pub. Date: Aug. 30, 2012

(65) Prior Publication Data
US 2012/0282748 A1    Nov. 8, 2012

(30) Foreign Application Priority Data
Feb. 25, 2011    (CN) .......................... 2011 1 0046360

(51) Int. Cl.
*H01L 21/8238*    (2006.01)
(52) U.S. Cl.
USPC ............................ 438/217; 438/276; 257/392
(58) Field of Classification Search
USPC .................. 438/174, 217, 276, 289; 257/392
See application file for complete search history.

(56) References Cited

U.S. PATENT DOCUMENTS

| | | | |
|---|---|---|---|
| 6,373,111 B1 * | 4/2002 | Zheng et al. | 257/407 |
| 7,655,550 B2 | 2/2010 | Schaeffer et al. | |
| 2008/0001202 A1 | 1/2008 | Schaeffer et al. | |
| 2010/0289089 A1 * | 11/2010 | Carter et al. | 257/392 |
| 2011/0127616 A1 * | 6/2011 | Hoentschel et al. | 257/392 |
| 2011/0175170 A1 * | 7/2011 | Wang et al. | 257/369 |

FOREIGN PATENT DOCUMENTS

CN    101800196 A    8/2010

OTHER PUBLICATIONS

Machine translation of CN-101800196. CN-101800196 published Aug. 11, 2010.*

* cited by examiner

*Primary Examiner* — Allen Parker

(57) ABSTRACT

The present disclosure provides a method for manufacturing a gate stack structure and adjusting a gate work function for a PMOS device, comprising: growing an ultra-thin interface oxide layer or oxynitride layer on a semiconductor substrate by rapid thermal oxidation or chemical method after conventional LOCOS or STI dielectric isolation is completed; depositing high-K gate dielectric and performing rapid thermal annealing; depositing a composite metal gate; depositing a barrier metal layer; depositing a polysilicon film and a hard mask and then performing photolithography and etching the hard mask; removing photoresist and etching the polysilicon film, the barrier metal layer, the metal gate, the high-K gate dielectric, and the interface oxide layer in sequence to form a gate stack structure of polysilicon film/barrier metal layer/metal gate/high-K gate dielectric; forming spacers, source/drain implantation in a conventional manner and performing rapid thermal annealing, whereby while source/drain dopants are activated, adjusting of metal gate effective work function of the PMOS device is achieved.

10 Claims, 1 Drawing Sheet

METHOD FOR MANUFACTURING STACK STRUCTURE OF PMOS DEVICE AND ADJUSTING GATE WORK FUNCTION

This application is a National Phase application of, and claims priority to, PCT Application No. PCT/CN2011/082538, filed on Nov. 21, 2011, entitled "METHOD FOR MANUFACTURING STACK STRUCTURE OF PMOS DEVICE AND ADJUSTING GATE WORK FUNCTION", which claimed priority to Chinese Application No. 201110046360.1, filed on Feb. 25, 2011. Both the PCT Application and Chinese Application are incorporated herein by reference in their entireties.

TECHNICAL FIELD

The present disclosure relates to the field of semiconductor technology, and in particular, to a method for manufacturing a PMOS metal gate/high-K gate dielectric stacks structure and adjusting a gate work function in gate-first process. The present disclosure is applicable to high-performance nanometer complementary metal oxide semiconductor (CMOS) devices of 32/22 nm node and below.

BACKGROUND

As feature sizes of CMOS devices continuously decrease in accordance with Moore Rule, development of CMOS integrated circuit encounters a great challenge. In order to overcome problems of small-size devices such as exponential increase of gate leakage current, severe polysilicon gate depletion, increasing gate resistance, and sever boron penetration of PMOS devices, it has become a consensus of the industry to use a high-K gate dielectric/metal gate structure to replace a conventional $SiO_2$/polysilicon gate structure. However, there are still many problems to be solved to integrate the metal gate to the high-K gate dielectric. For example, thermal stability problem, interfacial state problem, and especially Fermi pinning effect place a great challenge in obtaining an appropriate low threshold voltage required by nanometer CMOS devices. It is especially the case for PMOS devices, because the high work function required by the PMOS devices is even difficult to obtain.

SUMMARY

The present disclosure provides a method for manufacturing a metal gate/high-K gate dielectric stack structure and adjusting a gate work function for a PMOS device.

Therefore, the present disclosure utilizes a Physical Vapor Deposition (PVD) method to deposit a metal gate film comprising three layers of metal films on a high-K gate dielectric. First, a TiN-1 film is deposited, then a thin layer of Al film is deposited, and then a TiN-2 film is deposited. In this way, the whole metal gate is deposited. Then a barrier metal layer is deposited. A polysilicon film and a hard mask are deposited. Then photolithography is performed and the hard mask is etched. After removing photoresist, the polysilicon film, the barrier metal layer, the metal gate, the high-K dielectric, and an interface oxide layer are etched in sequence, to form a stack gate structure of polysilicon film/barrier metal layer/metal gate/high-K gate dielectric/interface oxide layer. Then formation of spacers, source/drain implantation and rapid thermal annealing are performed in a conventional manner. While source/drain dopants are activated, metal Al ions are driven to an interface between the high-K gate dielectric film and the interface oxide layer. Al—O dipoles are generated by interfacial reaction, whereby effective work function of the metal gate of the PMOS device can be adjusted. The effect of adjusting are related to parameters such as a deposition thickness of Al, a distance between the Al layer and the TiN/Hf-base high-K dielectric interface (i.e., a thickness of TiN-1), thermal processing condition, and status of a portion of the Hf-base high-K dielectric adjacent to a high-K dielectric/$SiO_2$ interface.

According to the present disclosure, there is provided a method for manufacturing a metal gate/high-K gate dielectric stack structure and adjusting a gate work function for a PMOS device, comprising:

Step 1) growing an ultra-thin interface oxide layer or oxynitride layer on a semiconductor substrate by rapid thermal oxidation or chemical method after conventional LOCOS or STI dielectric isolation is completed;

Step 2) forming a high-K gate dielectric film and performing thermal annealing at about 500-1050° C. for about 4-120 seconds;

Step 3) depositing a metal gate comprising three layers, i.e., a TiN-1 layer, a Al film, and a TiN-2 layer, wherein the TiN-1 layer has a thickness of about 2-6 nm, the metal Al film has a thickness of about 2-5 nm, and the TiN-2 layer has a thickness of about 10-20 nm;

Step 4) depositing a barrier metal layer;

Step 5) depositing a polysilicon film and a hard mask by low-pressure chemical vapor deposition and then performing photolithography and etching the hard mask;

Step 6) removing photoresist and etching the polysilicon film, the barrier metal layer, the metal gate, the high-K gate dielectric, and the interface $SiO_2$ in sequence using the hard mask to form a gate stack structure;

Step 7) forming spacers 1 and performing source/drain extension region low-energy ion implantation and large-angle implantation;

Step 8) forming spacers 2 and performing source/drain region ion implantation;

Step 9) performing rapid thermal annealing in $N_2$ at about 600-1050° C. for about 2-30 seconds, whereby while source/drain dopants are activated, metal Al ions are driven to an interface between the high-K gate dielectric film and the interface oxide layer, Al—O dipoles are generated by interfacial reaction so that effective work function of the metal gate of the PMOS device can be adjusted;

Step 10) forming a NiSi film; and

Step 11) forming contacts and metalizing by alloying annealing in $N_2$ or ($N_2$+$H_2$) in an alloying furnace at about 380-430° C. for about 30-60 minutes.

According to the method, before the step 1), the device, which has been subjected to conventional LOCOS or STI isolation, is cleansed by a conventional method, then is immersed in HF/isopropyl alcohol/water solution at room temperature for about 2-10 minutes, then is rinsed by deionized water and spun, and then is placed into a furnace immediately, wherein a volume ratio of HF:isopropyl alcohol:water is about 0.2-1.5%:0.01-0.10%:1%.

According to the method, in the step 1), the interface oxynitride layer may be formed by first implanting N into Si and then performing rapid thermal oxidation. Alternately, it may be formed by forming SiOx by rapid thermal oxidation and then forming SiON by NO nitridation or plasma nitridation. The SiOx may also be formed by $O_3$ chemical process.

According to the method, in the step 2), the high-K gate dielectric film is Hf-base oxide, which may be one of HfAlO, HfAlON, HfSiAlON and HfLaON. The high-K gate dielectric film may be formed by one of physical vapor deposition, metal organic chemical vapor deposition, and atom layer deposition.

According to the method, in the step 3), the metal nitride TiN gate film and the Al film may be formed by one of physical vapor deposition, metal organic chemical vapor deposition, and atom layer deposition.

According to the method, in the step 4), the barrier metal layer may be an AlN or TaN film, which may be formed by one of physical vapor deposition, metal organic chemical vapor deposition, and atom layer deposition, and has a thickness of about 4-10 nm.

According to the method, in the step 5), the hard mask may be one of $SiO_2(O)$, $Si_3N_4(N)$, and a stack thereof (O/N or O/N/O). The hard mask may be etched by F-base etching.

According to the method, in the step 6), the polysilicon is etched by F-base plus Cl-base etching or HBr-base plus Cl-base etching. The gate stack structure of TaN/TiN(Al)/high-K gate dielectric may be formed by Cl-base reactive ion etching or inductive coupling plasma etching, or by chemical wet etching.

According to the method, in the step 10), the NiSi may be formed by sputtering a Ni film of about 8-20 nm followed by two steps of annealing and selective etching performed between the two steps of annealing. The NiSi film may have a thickness of about 15-40 nm.

According to the method provided by the present disclosure, a metal Al film is deposited in a TiN metal gate. Metal Al ions are driven to an interface between the high-K gate dielectric film and the interface oxide layer by thermal process. Al—O dipoles are generated by interfacial reaction, whereby effective work function of the metal gate of the PMOS device can be adjusted. The effect of adjusting are related to parameters such as a deposition thickness of Al, a distance between the Al layer and the TiN/Hf-base high-K dielectric interface (i.e., a thickness of TiN-1), thermal processing condition, and status of a portion of the Hf-base high-K dielectric adjacent to a high-K dielectric/$SiO_2$ interface. A proper effective work function and therefore a proper low threshold voltage can be obtained by optimizing these parameters. The present disclosure has a good adjusting effect on the metal gate effective work function of PMOS devices. Furthermore, operations of the present disclosure are simple, controllable and cost-effective. The manufacturing processes are completely compatible with conventional CMOS processes and suitable for IC industrialization.

DETAILED DESCRIPTION OF EMBODIMENTS

Figure 1:
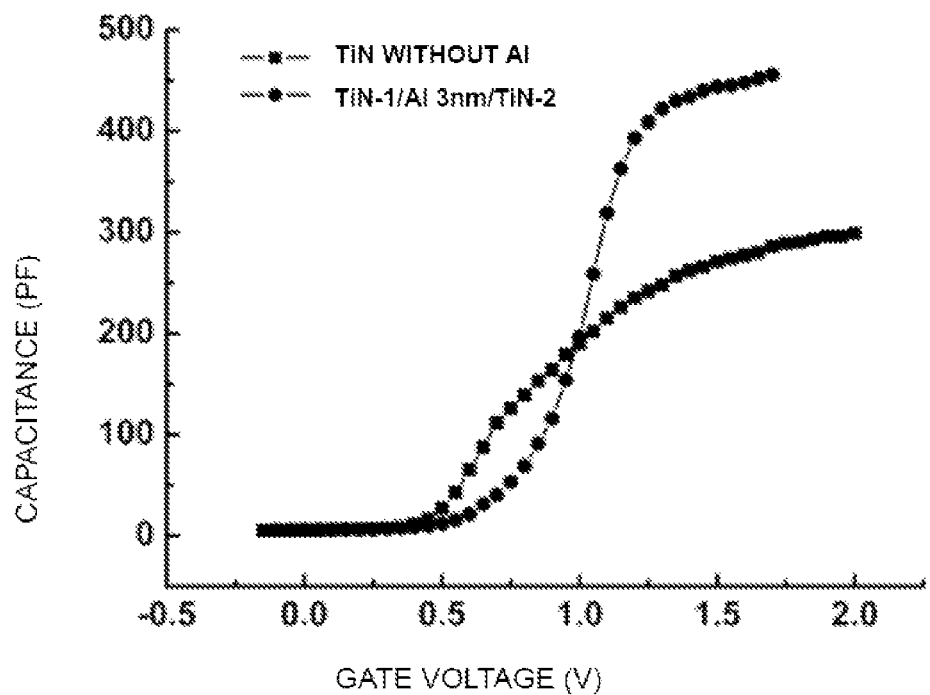
FIG. 1 shows a PMOS capacitance C-V characteristic comparison between a poly-Si/TiN-1/Al/TiN-2 metal stack and a TiN metal gate without the Al film.

The present disclosure provides a method for manufacturing a metal gate/high-K gate dielectric stack structure and adjusting a gate work function for a PMOS device. The method mainly comprises, after conventional LOCOS or STI dielectric isolation is completed:

Step 1) growing an ultra-thin interface oxide layer or oxynitride layer on a semiconductor substrate by rapid thermal oxidation or chemical method;

Step 2) forming a high-K gate dielectric film and performing thermal annealing at about 500-1000° C. for about 10-120 seconds;

Step 3) depositing a metal gate by physical vapor deposition, wherein a thin layer of TiN-1 film is first deposited by reactive sputtering, then a thin layer of Al film is deposited by sputtering, and then a layer of TiN-2 film is deposited by reactive sputtering;

Step 4) depositing a barrier metal layer;

Step 5) depositing a polysilicon film and a hard mask by low-pressure chemical vapor deposition and then performing photolithography and etching the hard mask;

Step 6) removing photoresist and etching the polysilicon film, the barrier metal layer, the metal gate, the high-K gate dielectric, and the interface $SiO_2$ in sequence using the hard mask to form a gate stack structure;

Step 7) forming spacers 1 and performing source/drain extension region low-energy ion implantation and large-angle implantation;

Step 8) forming spacers 2 and performing source/drain region ion implantation;

Step 9) performing rapid thermal annealing in $N_2$ at about 600-1050° C. for about 2-30 seconds, whereby while source/drain dopants are activated, metal Al ions are driven to an interface between the high-K gate dielectric film and the interface oxide layer, Al—O dipoles are generated by interfacial reaction so that effective work function of the metal gate of the PMOS device can be adjusted;

Step 10) forming a NiSi film; and

Step 11) forming contacts and metalizing by alloying annealing in $N_2$ or ($N_2$+$H_2$) in an alloying furnace at about 380-430° C. for about 30-60 minutes.

The present disclosure is explained in detail as below.

Step 1): Cleansing. After isolations of the device have been formed, the device is cleansed before the interface oxide layer is formed. First, the device is cleansed by a conventional method, then is immersed in HF/isopropyl alcohol/water solution at room temperature for about 2-10 minutes, then is rinsed by deionized water and spun in N2, and then is placed into a furnace immediately, wherein a volume ratio of HF:isopropyl alcohol:water is about 0.3-0.8%:0.01-0.08%:1%.

Step 2): forming a SiOx interface layer. An oxide layer of about 6-8 Å is formed by rapid thermal annealing (RTA) in $N_2$ at about 600-800° C. for about 20-120 seconds.

Step 3): forming a high-K gate dielectric film. A HfSiAlON film is deposited by alternately sputtering an Al target, a Hf target, and a Si target in $N_2$/Ar mixed gases by reactive magnetic sputtering. The sputtering is conducted with an operation pressure of about $5\times10^{-3}$ Torr and a sputtering power of about 100-500 W. The HfSiAlON high-K gate dielectric film formed by deposition has a thickness of about 10-50 Å.

Step 4): ultrasound cleansing. The wafer is subjected to ultrasound cleansing in acetone for about 5-10 minutes and then in absolute ethyl alcohol for about 5-10 minutes, and then is rinsed by deionized water and spun in $N_2$.

Step 5): depositing high-K dielectric and rapid thermal annealing. The wafer is spun and then is placed into an annealing furnace immediately. The annealing is conducted at about 500-1000° C. for about 10-120 seconds in $N_2$.

Step 6): depositing a metal gate film. The metal gate film comprises three metal layers: TiN-1/Al/TiN-2. The TiN-1 and Ti—N2 metal gate films are formed by sputtering a Ti target in $N_2$/Ar mixed gases by reactive magnetic sputtering. The sputtering is conducted with an operation pressure of about $5\times10^{-3}$ Torr, a $N_2$ flow of about 2-8 sccm, and a sputtering power of about 600-1000 w. The TiN-1 metal gate has a thickness of about 2-5 nm. The TiN-2 metal gate has a thickness of about 10-20 nm. The Al film has a thickness of about 2-5 nm and is formed by sputtering an Al target in Ar gas by reactive magnetic sputtering. The sputtering is conducted with an operation pressure of about $5\times10^{-3}$ Torr, an Ar flow of about 20-24 sccm, and a sputtering power of about 100-500 w.

Step 7): depositing a barrier metal layer, which may be a TaN film, by reactive magnetic sputtering. The sputtering is conducted with an operation pressure of about $5\times10^{-3}$ Torr, a $N_2$ flow of about 2-8 sccm, and a sputtering power of about 600-1000 w. The TaN film may have a thickness of about 4-8 nm.

Step 8) depositing a polysilicon film and a $SiO_2$ hard mask by low-pressure chemical vapor deposition and then performing photolithography and etching the hard mask by F-base etching.

Step 9) removing photoresist and etching the polysilicon film/TaN/TiN(Al) metal gate/high-K gate dielectric HfSiAlON/interface $SiO_2$ in sequence using the hard mask to form a gate stack structure.

The polysilicon is etched by F-base plus Cl-base etching or HBr-base plus Cl-base etching. The gate stack structure of TaN/TiN(Al) metal gate/high-K gate dielectric HfSiAlON/interface $SiO_2$ stack structure may be formed by Cl-base reactive ion etching or inductive coupling plasma etching, or by chemical wet etching.

Step 10) forming spacers 1 and performing source/drain extension region low-energy ion implantation and large-angle implantation in a conventional manner.

Step 11) forming spacers 2 and performing source/drain region ion implantation in a conventional manner.

Step 12) performing rapid thermal annealing in $N_2$ at about 600-1050° C. for about 2-30 seconds, whereby while source/drain dopants are activated, metal Al ions are driven to an interface between the high-K gate dielectric film and the interface oxide layer, Al—O dipoles are generated by interfacial reaction so that effective work function of the metal gate of the PMOS device can be adjusted.

Step 13) forming a NiSi film. The NiSi film may be formed by sputtering a Ni film of about 8-15 nm followed by two steps of annealing and selective etching performed between the two steps of annealing. The NiSi film may have a thickness of about 15-40 nm.

Step 14) forming contacts and metalizing by alloying annealing in $N_2$ or ($N_2+H_2$) in an alloying furnace at about 380-430° C. for about 30-60 minutes.

As shown in FIG. 1, after the Al film of about 3 nm is added between the TiN-1 film and the TiN-2 film, a flat-band voltage ($V_{FB}$) moves in a positive direction by a great magnitude. The $V_{FB}$ is increased by about 0.135V, indicating that the effective work function of the PMOS device is greatly increased, which satisfies the requirement of the PMOS device on the gate work function. The gate dielectric equivalent thickness of the Al-added sample is substantially reduced (causing capacitance to increase) from about 34 Å to about 23 Å, which helps to improve device driving capability and gate control capability. The parameters are shown in table 1.

Figure 2:
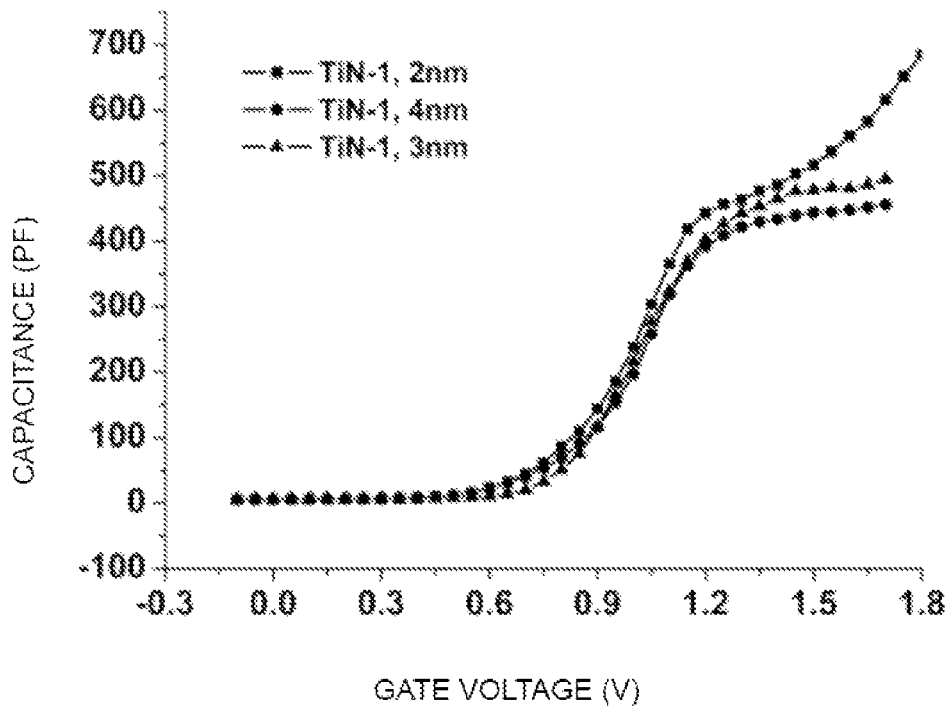
FIG. 2 shows a PMOS capacitance C-V characteristic comparison between poly-Si/TiN-1/Al/TiN-2 metal stacks with different TiN-1 film thicknesses.

As shown in FIG. 2, for a same Al film thickness (3 nm), the TiN-1 film has different thicknesses. The flat-band voltages move in the positive direction by different magnitudes. The thickness of the TiN-1 film needs to be optimized. If it is thin, gate leakage current will increase, as shown in a C-V characteristic of a sample comprising a TiN-1 film of about 2 nm in FIG. 2. If it is thick, adjusting ability of gate work function will degrade, as shown in a C-V characteristic of a sample comprising a TiN-1 film of about 4 nm in FIG. 2. A sample comprising a TiN-1 film of about 3 nm has a good C-V characteristic. There is no leakage current and the flat-band voltage is large. Table 2 shows a comparison of characteristic parameters between samples with different TiN-1 film thicknesses. These samples have a same electrode structure of poly-Si/TaN/TiN-1/Al3 nm/TiN-2/HfSiAlON/$SiO_2$.

The present disclosure has been described with reference to specific embodiments thereof. However, these embodiments are only for purpose of illustration rather than limitation of the scope of the present disclosure. The scope of the present disclosure is defined by the accompanied claims and equivalents thereof. One of ordinary skill in the art can make various substitutions and modifications without departing from the scope of the present disclosure. All of the substitutions and modifications fall within the scope of the present disclosure.

TABLE 1

| i. GATE ELECTRODE STRUCTURE | GATE DIELECTRIC THICKNESS (Å) | FLAT BAND VOLTAGE (V) |
|---|---|---|
| Poly-Si/TaN/TiN/HfSiAlON/$SiO_2$ (No Al) | 34 | 0.484 |
| Poly-Si/TaN/TiN-1/Al 3 nm/TiN-2/HfSiAlON/$SiO_2$ | 23 | 0.619 |

TABLE 2

| TiN-1 FILM THICKNESS (nm) | GATE DIELECTRIC THICKNESS (Å) | FLAT BAND VOLTAGE (V) |
|---|---|---|
| a. 2 | b. 13 | c. 0.596 |
| d. 4 | e. 23 | f. 0.623 |
| g. 3 | h. 21 | i. 0.684 |

What is claimed is:

1. A method for manufacturing a gate stack structure and adjusting a gate work function for a PMOS device, comprising:
   1) growing an interface oxide or oxynitride layer on a semiconductor substrate after conventional LOCOS or STI dielectric isolation is completed;
   2) forming a high-K gate dielectric film on the interface oxide or oxynitride layer and performing thermal annealing at about 500-1020° C. for about 4-120 seconds;
   3) depositing a metal gate comprising a first TiN layer, an Al film, and a second TiN layer in sequence;
   4) depositing a barrier metal layer on the metal gate;
   5) depositing a polysilicon film and a hard mask on the barrier metal layer by low-pressure chemical vapor deposition and then performing photolithography and etching the hard mask;
   6) removing photoresist and etching the polysilicon film, the barrier metal layer, the metal gate, the high-K gate dielectric, and the interface $SiO_2$ in sequence using the hard mask to form a gate stack structure;
   7) forming first spacers and performing source/drain extension region low-energy ion implantation and large-angle implantation;
   8) forming second spacers and performing source/drain region ion implantation;
   9) performing rapid thermal annealing in $N_2$ at about 600-1050° C. for about 2-30 seconds, whereby while source/drain dopants are activated, metal Al ions from the Al film are driven to an interface between the high-K gate dielectric film and the interface oxide or oxynitride layer and Al—O dipoles are generated by interfacial reaction thereby adjusting the effective work function of the metal gate of the PMOS device;

10) forming a NiSi film; and 11) forming contacts on the NiSi film and metalizing by alloying annealing in $N_2$ or ($N_2+H_2$) in an alloying furnace at about 380-430° C. for about 30-60 minutes.

2. The method according claim 1, wherein before the step 1), the device, which has been subjected to conventional LOCOS or STI isolation, is cleansed by a conventional method, then is immersed in HF/isopropyl alcohol/water solution at room temperature for about 2-10 minutes, then is rinsed by deionized water and spun, and then is placed into a furnace immediately, wherein a weight volume ratio of HF:isopropyl alcohol:water is about 0.2-1.5%:0.01-0.10%: 1%.

3. The method according to claim 1, wherein in the step 1):
the interface oxide layer or oxynitride layer is grown by rapid thermal oxidation or chemical method;
the interface oxynitride layer is formed by first implanting N into Si and then performing rapid thermal oxidation, or by forming SiOx by rapid thermal oxidation and then forming SiON by NO nitridation or plasma nitridation, wherein SiOx is formed by $O_3$ chemical process.

4. The method according to claim 1, wherein in the step 2):
the high-K gate dielectric film comprises Hf-base oxide high-K gate dielectric, which is one of HfAlO, HfAlON, HfSiAlON and HfLaON;
the high-K gate dielectric film is formed by one of physical vapor deposition, metal organic chemical vapor deposition, and atom layer deposition.

5. The method according to claim 1, wherein in the step 3), the first TiN film has a thickness of about 2-6 nm, the Al film has a thickness of about 2-5 nm, and the second TiN film has a thickness of about 10-20 nm.

6. The method according to claim 1, wherein in the step 3), the metal nitride gate film and the Al film may be formed by one of physical vapor deposition, metal organic chemical vapor deposition, and atom layer deposition.

7. The method according to claim 1, wherein in the step 4), the barrier metal layer comprises TaN or AN and has a thickness of about 4-10 nm, which is formed by one of physical vapor deposition, metal organic chemical vapor deposition, and atom layer deposition.

8. The method according to claim 1, wherein in the step 5), the hard mask is one of $SiO_2$, $Si_3N_4$, and a stack thereof, which is $SiO_2/Si_3N_4$ or $SiO_2/Si_3N_4/SiO_2$, and the hard mask is etched by F-base etching.

9. The method according to claim 1, wherein in the step 6):
the polysilicon is etched by F-base plus Cl-base etching or HBr-base plus Cl-base etching; and
the gate stack structure of TaN/TiN/Al/TiN/high-K gate dielectric/interface oxide or oxynitride layer is formed by Cl-base reactive ion etching or inductive coupling plasma etching, or by chemical wet etching.

10. The method according to claim 1, wherein in the step 10):
the NiSi is formed by sputtering a Ni film of about 8-20 nm followed by two steps of annealing and selective etching performed between the two steps of annealing; and
the NiSi film has a thickness of about 15-40 nm.

* * * * *